(12) United States Patent
Zhu

(10) Patent No.: US 8,384,569 B2
(45) Date of Patent: Feb. 26, 2013

(54) CIRCUIT AND METHOD FOR GENERATING THE STOCHASTIC SIGNAL

(75) Inventor: Guojun Zhu, Chengdu (CN)

(73) Assignee: IPGoal Microelectronics (SiChuan) Co., Ltd, Chengdu, Sichuan Province (CN)

( * ) Notice: Subject to any disclaimer, the term of this patent is extended or adjusted under 35 U.S.C. 154(b) by 134 days.

(21) Appl. No.: 13/091,043

(22) Filed: Apr. 20, 2011

(65) Prior Publication Data

US 2011/0260897 A1 Oct. 27, 2011

(30) Foreign Application Priority Data

Apr. 21, 2010 (CN) .......................... 2010 1 0153841

(51) Int. Cl.
*H03M 1/04* (2006.01)

(52) U.S. Cl. ........ 341/109; 375/226; 375/231; 375/371; 375/376; 375/229; 714/709; 714/724; 714/738; 714/744; 714/716; 327/141; 370/395.62; 716/106; 716/111; 716/132

(58) Field of Classification Search .......... 375/215–231, 375/371–376; 341/109–110; 704/219, 223, 704/262; 714/712–738; 327/141; 370/395.62; 716/106, 111, 132

See application file for complete search history.

(56) References Cited

U.S. PATENT DOCUMENTS

| | | | | |
|---|---|---|---|---|
| 5,170,071 A | * | 12/1992 | Shreve | 706/43 |
| 5,752,223 A | * | 5/1998 | Aoyagi et al. | 704/219 |
| 5,913,259 A | * | 6/1999 | Grubb et al. | 84/610 |
| 7,243,320 B2 | * | 7/2007 | Chiu et al. | 716/106 |
| 7,265,595 B1 | * | 9/2007 | Kutz et al. | 327/143 |
| 7,268,790 B1 | * | 9/2007 | Small et al. | 345/596 |
| 7,486,844 B2 | * | 2/2009 | Chang et al. | 382/300 |
| 7,493,353 B2 | * | 2/2009 | Ueda et al. | 708/3 |
| 7,571,363 B2 | * | 8/2009 | Wallace et al. | 714/724 |

* cited by examiner

*Primary Examiner* — Lam T Mai

(57) ABSTRACT

A stochastic signal generation circuit includes a signal output circuit and a signal processing circuit connected with the signal output circuit. The signal output circuit includes two matching semiconductor components, wherein the signal output circuit detects a slight mismatch between the two matching semiconductor components, converts the detected slight mismatch into a corresponding electric signal, amplifies the electric signal, and outputs an analog voltage signal. The signal processing circuit converts the analog voltage signal into a stochastic digital signal. Also, a method for generating a stochastic signal is provided. The present invention decreases the cost of the integrated circuit, and better ensures the information security of the electronic products.

20 Claims, 2 Drawing Sheets

US 8,384,569 B2

CIRCUIT AND METHOD FOR GENERATING THE STOCHASTIC SIGNAL

BACKGROUND OF THE PRESENT INVENTION

1. Field of Invention

The present invention relates to a signal generation circuit and method, and more particularly to a circuit and method for generating the stochastic signal.

2. Description of Related Arts

Stochastic signals, as serial numbers, are widely used in various electronic products and play a very important role in the information security of the electronic products. At present, the serial numbers of the electronic products are generated by two methods. In the first method, the serial numbers are generated by the software. The serial numbers are provided by some randomized algorithms of the software. Therefore, the first method is adapted for the electronic products having the software operation, and it is prone to be cracked. In the second method, the serial numbers are generated by the hardware, namely, the internal integrated circuits. In generally, after finishing the integrated circuit manufacturing process, some branches of the internal circuits of the integrated circuits are fused at the high temperature or one-time programmable circuit programming is made for generating various serial numbers of the integrated circuits. The second method is performed after finishing the integrated circuit manufacturing process, so the cost of the integrated circuit is increased. Furthermore, it cannot ensure the uniqueness of the serial number among different integrated circuits. Also, the information security of the electronic products using the integrated circuits is decreased.

SUMMARY OF THE PRESENT INVENTION

An object of the present invention is to provide a circuit and method for generating the stochastic signal, which are capable of directly generating the stochastic signal during the integrated circuit manufacturing process.

Another object of the present invention is to provide a circuit and method for generating the stochastic signal, which are capable of better ensuring the uniqueness of the serial number among different integrated circuits.

Accordingly, in order to accomplish the above objects, the present invention provides a stochastic signal generation circuit, comprising:

a signal output circuit comprising two matching semiconductor components, wherein the signal output circuit detects a slight mismatch between the two matching semiconductor components, converts the detected slight mismatch into a corresponding electric signal, amplifies the electric signal, and outputs an analog voltage signal; and a signal processing circuit connected with the signal output circuit, wherein the signal processing circuit converts the analog voltage signal into a stochastic digital signal.

Furthermore, the present invention provides a method for generating a stochastic signal, comprising the steps of:

(1) detecting a slight mismatch between two matching semiconductor components by a signal output circuit, and converting the detected slight mismatch into a corresponding electric signal;

(2) generating an analog voltage signal by amplifying the electric signal through the signal output circuit; and (3) outputting a stochastic digital signal by making a digitalized treatment to the analog voltage signal through a signal processing circuit.

Compared with the prior art, the stochastic signal of the present invention is directly generated during the integrated circuit manufacturing process. After finishing the integrated circuit manufacturing process, the stochastic signal will be generated, and only needs to be read out. Therefore, no follow-up work is needed, thereby greatly decreasing the cost of the integrated circuit. Furthermore, no artificially operation exists, the probability of the uniqueness of the serial number among different integrated circuits can be improved, thereby better ensuring the information security of the electronic products.

These and other objectives, features, and advantages of the present invention will become apparent from the following detailed description, the accompanying drawings, and the appended claims.

DETAILED DESCRIPTION OF THE PREFERRED EMBODIMENT

A stochastic signal generation circuit according to a preferred embodiment of the present invention is illustrated, which comprises a signal output circuit and a signal processing circuit.

Figure 1:
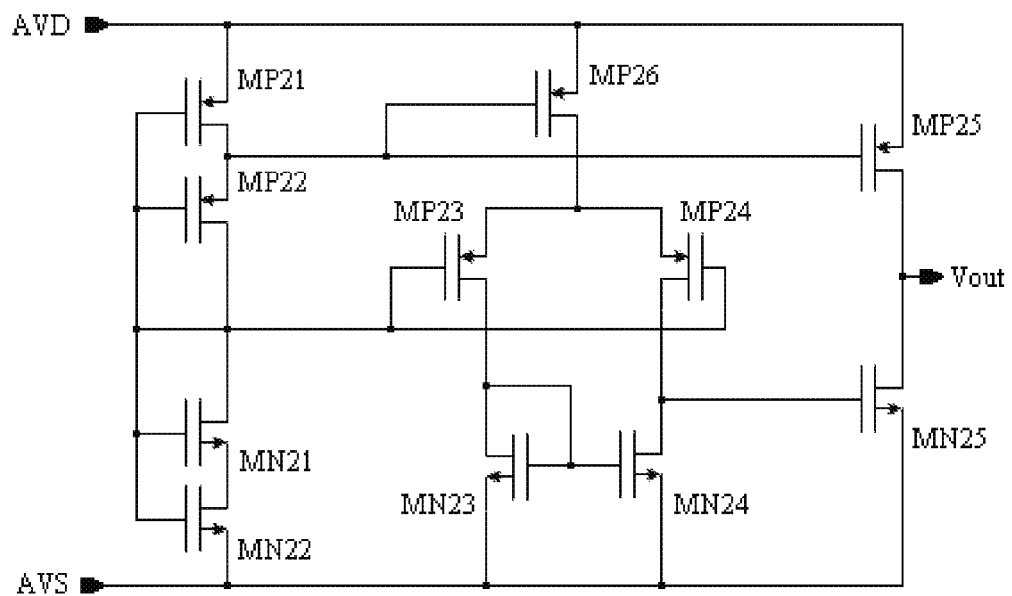
FIG. 1 is a circuit diagram of a signal output circuit of a stochastic signal generation circuit according to a preferred embodiment of the present invention.

As shown in FIG. 1, the signal output circuit according to the preferred embodiment of the present invention is illustrated, which comprises a power supply AVD, a ground AVS, an output end Vout and a plurality of field effect transistors (FETs) consisting of MP21, MP22, MP23, MP24, MP25, MP26, MN21, MN22, MN23, MN24 and MN25. The FETs MN23, MN24 and MN25 form an amplifying sub circuit. The FETs MP21, MP22, MN21, MN22, MP25 and MP26 form a bias sub circuit to provide the stable current for the amplifying sub circuit. In the preferred embodiment of the present invention, the FETs MP21, MP22, MP23, MP24, MP25 and MP26 are P-type field effect transistors (PMOS), and the FETs MN21, MN22, MN23, MN24 and MN25 are N-type field effect transistors (NMOS). In other embodiments, the FETs can be replaced by the switching components or circuits which are capable of achieving the same function as required.

The connection relations of the signal output circuit are described as follows. The gates of the FETs MP21, MP22, MN21 and MN22 are connected with each other. The drain of the FET MP21 is connected with the source of the FET MP22. The drain of the FET MP22 is connected with the drain of the FET MN21. The source of the FET MN21 is connected with the drain of the FET MN22. The sources of the FETs MP21, MP25 and MP26 are connected with the power supply AVD. The gates of the FETs MP26 and MP25 are connected with the drain of the FET MP21. The sources of the FETs MP23 and MP24 are connected with the drain of the FET MP26. The gate of the FET MP23 is connected with the drain of the FET MP22. The gate of the FET MP24 is connected with the drain of the FET MP22. The drain of the FET MP25 and the drain of the FET MN25 are connected with the output end Vout. The source of the FET MN22, the source of the FET MN23, the source of the FET MN24 and the source of the FET MN25 are connected with the ground AVS. The drain of the FET MP23, the drain of the FET MN23, the gate of the FET MN23 are connected with the gate of the FET MN24. The drain of the FET MN24 and the drain of the FET MP24 are connected with the gate of the FET MN25. The gate of the FET MP22 is connected with the drain of the FET MP22.

The working principle of the signal output circuit is described as follows. During the integrated circuit manufacturing process, owing to the edge effect, the ion implantation gradient effect, the surface state effect, the change of the carrier mobility and other undesirable factors, the stochastic slight mismatch will be generated between the FETs MP23 and MP24 as two matching semiconductor components which match in the theoretical design, such as the mismatch of the length and width, the mismatch of the threshold voltage or the mismatch of the saturation current between the FETs MP23 and MP24. Accordingly, the drains of the FETs MP23 and MP24 respectively output two electric signals with different sizes, the two electric signals respectively pass through the FETs MN23 and MN24, so that the drain of the FET MN24 outputs a weak voltage signal to the gate of the FET MN25. The drain of the FET MN25 outputs an amplified analog voltage signal to the output end Vout.

Figure 2:
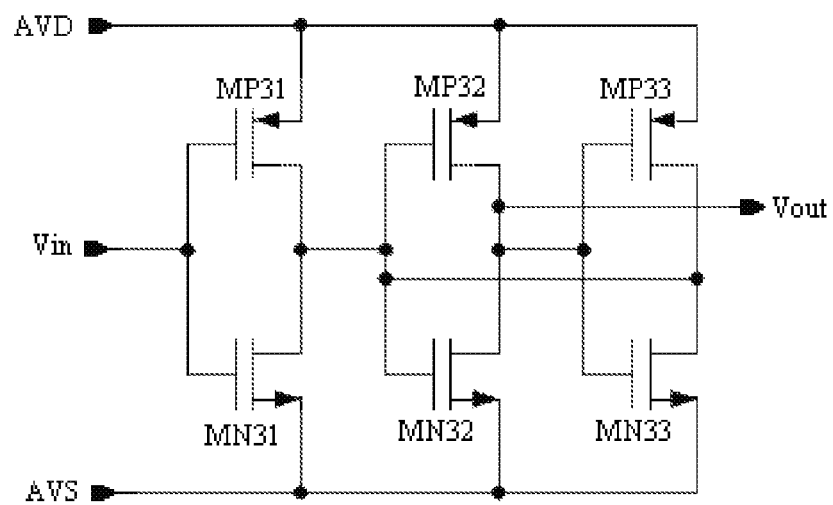
FIG. 2 is a circuit diagram of a signal processing circuit of a stochastic signal generation circuit according to the preferred embodiment of the present invention.

As shown in FIG. 2, the signal processing circuit according to the preferred embodiment of the present invention is illustrated, which comprises a power supply AVD, a ground AVS, an input end Vin for receiving the analog voltage signal which is output from the output end Vout of the signal output circuit, an output end Vout, and a plurality of FETs consisting of FETs MP31, MP32, MP33, MN31, MN32 and MN33. In the preferred embodiment of the present invention, the FETs MP31, MP32 and MP33 are P-type field effect transistors (PMOS), the FETs MN31, MN32 and MN33 are N-type field effect transistors (NMOS). In other embodiments, the FETs can be replaced by the switching components or circuits which are capable of achieving the same function as required.

The connection relations of the signal processing circuit are described as follows. The source of the FET MP31, the source of the FET MP32 and the source of the FET MP33 are connected with the power supply AVD. The gate of the FET MP31 and the gate of the FET MN31 are connected with the input end Vin, thus acting as the input end of the signal processing circuit. The drain of the FET MP31, the drain of the FET MN31, the gate of the FET MP32, the gate of the FET MN32, the drain of the FET MP33 and the drain of the FET MN33 are connected with each other. The drain of the FET MP32, the drain of the FET MN32, the gate of the FET MP33 and the gate of the FET MN33 are connected with the output end Vout, thus acting as the output end of the signal processing circuit. The source of the FET MN31, the source of the FET MN32 and the source of the FET MN33 are connected with the ground AVS.

The working principle of the signal processing circuit is described as follows. The FETs MP31 and MN31 form an inverter circuit. The amplified analog voltage signal, which is output by the output end Vout of the signal output signal, is converted into the digital signal having the high and low levels. The FETs MP32, MN32, MP33 and MN33 form a latch circuit to output the digital signal which is output by the inverter circuit in the latching manner.

Figure 3:
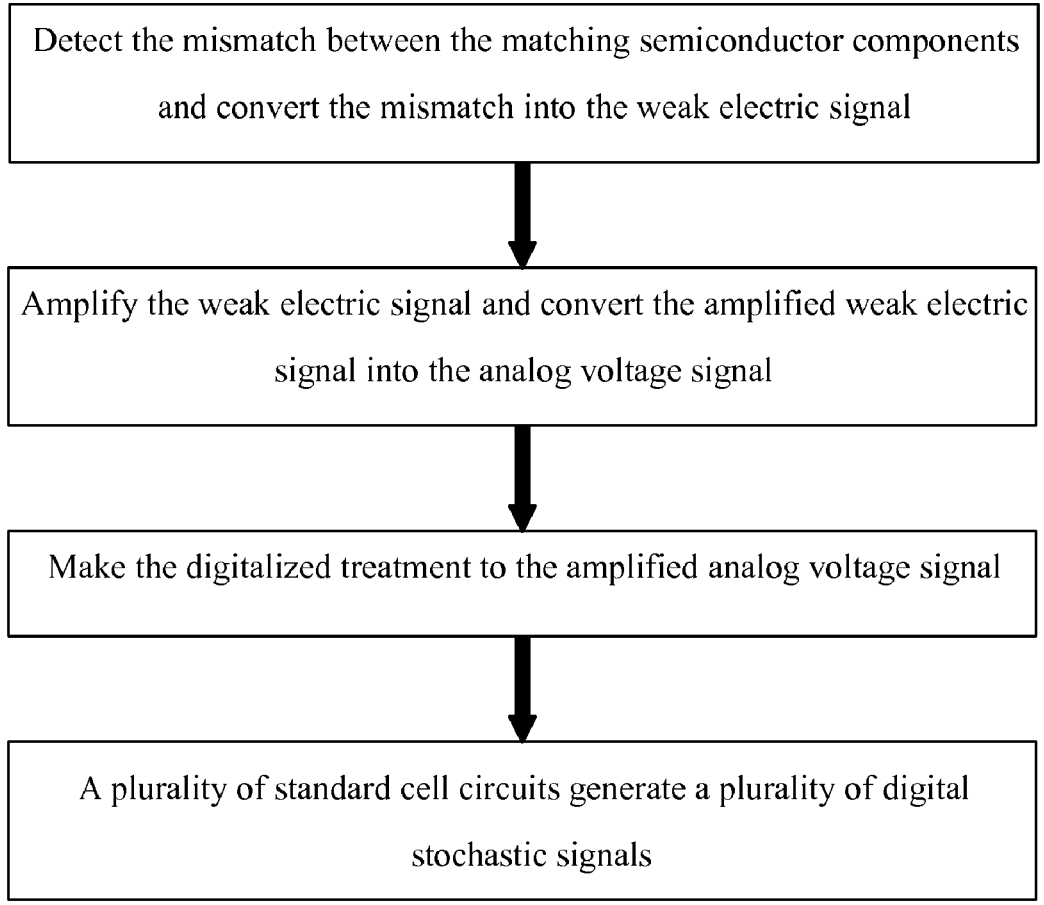
FIG. 3 is a flow chart of a method for generating the stochastic signals according to the preferred embodiment of the present invention.

Referring to FIG. 3, a method for generating the stochastic signals according to the preferred embodiment of the present invention is illustrated, wherein the method comprises the steps as below.

(1) Detect the slight mismatch between two matching semiconductor components by the signal output circuit, and convert the detected slight mismatch into the corresponding weak electric signal.

(2) Amplify the weak electric signal by the amplifying sub circuit to generate an amplified analog voltage signal which is related with the slight mismatch.

(3) Make the digitalized treatment to the amplified analog voltage signal by the signal processing circuit and output a stochastic digital signal.

(4) Take the stochastic signal generation circuit as a standard cell circuit, place a plurality of the standard cell circuits at various regions of the integrated circuit layout to generate a plurality of irrelevant stochastic signals.

The matching semiconductor components comprise the resistors, capacitors, inductors, FETs, triodes, diodes and so on. The slight mismatch comprises the mismatch of the size of the semiconductor components, the mismatch of the electrical parameters and so on.

In the preferred embodiment of the present invention, the matching semiconductor components are FETs MP23 and MP24. During the integrated circuit manufacturing process, owing to the edge effect, the ion implantation gradient effect, the surface state effect, the change of the carrier mobility and other undesirable factors, the stochastic slight mismatch will be generated between the FETs MP23 and MP24. Accordingly, the drains of the FETs MP23 and MP24 respectively output two electric signals with different sizes, the two electric signals respectively pass through the FETs MN23 and MN24, so that the drain of the FET MN24 outputs a weak voltage signal to the gate of the FET MN25. The drain of the FET MN25 outputs an amplified analog voltage signal to the output end Vout, and inputs the amplified analog voltage signal to the signal processing circuit through the input end Vin of the signal processing circuit. The output end Vout of the signal processing circuit outputs a stochastic digital signal.

Owing to the unpredictability of the slight mismatch between the semiconductor components, the present invention makes use of the slight mismatch which is generated in the integrated circuit manufacturing process, converts the slight mismatch of the matching semiconductor components into the electric signal by the signal output circuit, and then amplifies and makes the digitalized treatment to the electric signal, and finally obtains a needed stochastic signal. The stochastic signal generation circuit is regarded as a standard cell circuit. Place a plurality of standard cell circuits at various regions of the integrated circuit layout to generate a plurality of irrelevant stochastic signals. The stochastic signals are directly generated during the integrated circuit manufacturing process. After finishing the integrated circuit manufacturing process, the stochastic signals will be generated, and only needs to be read out. Therefore, no follow-up work is needed, thereby greatly decreasing the cost of the integrated circuit. Furthermore, no artificially operation exists, the probability of the uniqueness of the serial number among different integrated circuits can be improved, thereby better ensuring the information security of the electronic products.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A stochastic signal generation circuit, comprising:
a signal output circuit comprising two matching semiconductor components and an amplifying sub circuit, wherein a slight mismatch between said two matching semiconductor components is converted into two electric signals with different sizes by said two matching semiconductor components, said two matching semiconductor components output said two electric signals to said amplifying sub circuit, said amplifying sub circuit outputs an amplified analog voltage signal; and
a signal processing circuit connected with said signal output circuit, wherein said signal processing circuit converts said analog voltage signal into a stochastic digital signal.

2. The stochastic signal generation circuit, as recited in claim 1, wherein said signal processing circuit comprises an inverter circuit and a latch circuit connected with said inverter circuit, wherein said inverter circuit converts said analog voltage signal into a digital signal having high and low levels, and said latch circuit outputs said digital signal in a latching manner.

3. The stochastic signal generation circuit, as recited in claim 1, wherein said signal output circuit further comprises a bias sub circuit connected with said amplifying sub circuit for providing said amplifying sub circuit with a stable current.

4. The stochastic signal generation circuit, as recited in claim 2, wherein said signal output circuit further comprises a bias sub circuit connected with said amplifying sub circuit for providing said amplifying sub circuit with a stable current.

5. The stochastic signal generation circuit, as recited in claim 1, wherein said two matching semiconductor components are two P-type matching field effect transistors connected with each other.

6. The stochastic signal generation circuit, as recited in claim 2, wherein said two matching semiconductor components are two P-type matching field effect transistors connected with each other.

7. The stochastic signal generation circuit, as recited in claim 3, wherein said two matching semiconductor components are two P-type matching field effect transistors connected with each other.

8. The stochastic signal generation circuit, as recited in claim 4, wherein said two matching semiconductor components are two P-type matching field effect transistors connected with each other.

9. The stochastic signal generation circuit, as recited in claim 1, wherein said amplifying sub circuit comprises three N-type field effect transistors connected with each other, a drain of one of said N-type field effect transistors outputs said analog voltage signal.

10. The stochastic signal generation circuit, as recited in claim 2, wherein said amplifying sub circuit comprises three N-type field effect transistors connected with each other, a drain of one of said N-type field effect transistors outputs said analog voltage signal.

11. The stochastic signal generation circuit, as recited in claim 3, wherein said amplifying sub circuit comprises three N-type field effect transistors connected with each other, a drain of one of said N-type field effect transistors outputs said analog voltage signal.

12. The stochastic signal generation circuit, as recited in claim 4, wherein said amplifying sub circuit comprises three N-type field effect transistors connected with each other, a drain of one of said N-type field effect transistors outputs said analog voltage signal.

13. The stochastic signal generation circuit, as recited in claim 5, wherein said amplifying sub circuit comprises three N-type field effect transistors connected with each other, a drain of one of said N-type field effect transistors outputs said analog voltage signal.

14. The stochastic signal generation circuit, as recited in claim 6, wherein said amplifying sub circuit comprises three N-type field effect transistors connected with each other, a drain of one of said N-type field effect transistors outputs said analog voltage signal.

15. The stochastic signal generation circuit, as recited in claim 7, wherein said amplifying sub circuit comprises three N-type field effect transistors connected with each other, a drain of one of said N-type field effect transistors outputs said analog voltage signal.

16. The stochastic signal generation circuit, as recited in claim 8, wherein said amplifying sub circuit comprises three N-type field effect transistors connected with each other, a drain of one of said N-type field effect transistors outputs said analog voltage signal.

17. A method for generating stochastic signals, comprising the steps of:
(1) detecting a slight mismatch between two matching semiconductor components by a signal output circuit, and converting the detected slight mismatch into a corresponding electric signal;
(2) generating an analog voltage signal by amplifying the electric signal through an amplifying sub circuit of the signal output circuit; and
(3) outputting a stochastic digital signal by making a digitalized treatment to the analog voltage signal through a signal processing circuit.

18. The method, as recited in claim 17, further comprising a step of generating a plurality of irrelevant stochastic signals by taking the stochastic signal generation circuit as a standard cell circuit and placing a plurality of the standard cell circuits at various regions of the integrated circuit layout.

19. The method, as recited in claim 18, wherein the two matching semiconductor components are two matching field effect transistors connected with each other, and the amplifying sub circuit comprises three field effect transistors connected with each other.

20. The method, as recited in claim 19, wherein the signal output circuit comprises a bias sub circuit connected with the amplifying sub circuit for providing the amplifying sub circuit with a stable current.

* * * * *